United States Patent
Chao et al.

(10) Patent No.: US 8,575,926 B2
(45) Date of Patent: Nov. 5, 2013

(54) PLANAR MAGNETIC FIELD PROBE

(75) Inventors: Shih-Chieh Chao, Taipei (TW); Chih-Wen Huang, Taipei (TW)

(73) Assignee: Tatung Company, Taipei (TW)

( * ) Notice: Subject to any disclaimer, the term of this patent is extended or adjusted under 35 U.S.C. 154(b) by 372 days.

(21) Appl. No.: 13/115,995

(22) Filed: May 26, 2011

(65) Prior Publication Data

US 2012/0187944 A1    Jul. 26, 2012

(30) Foreign Application Priority Data

Jan. 20, 2011  (TW) .............................. 100102043 A

(51) Int. Cl.
*G01R 33/02*    (2006.01)
(52) U.S. Cl.
USPC ....... 324/244; 324/258; 324/260; 324/754.29
(58) Field of Classification Search
None
See application file for complete search history.

(56) References Cited

U.S. PATENT DOCUMENTS

| 5,777,470 | A  * | 7/1998  | Adler et al. .................... 324/258 |
| 6,856,131 | B2 * | 2/2005  | Miyazawa et al. ............ 324/252 |
| 7,362,098 | B2   | 4/2008  | Ando et al. |
| 2007/0177414 | A1 | 8/2007 | Funato et al. |
| 2009/0322326 | A1 | 12/2009 | Ito et al. |

FOREIGN PATENT DOCUMENTS

TW    I254134    5/2006

* cited by examiner

*Primary Examiner* — Minh N Tang
(74) *Attorney, Agent, or Firm* — Jianq Chyun IP Office

(57) ABSTRACT

A planar magnetic field probe is provided. The planar magnetic field probe increases the sensitivity of magnetic field intensity detection by using a left multi-sensor loop and a right multi-sensor loop formed by a first patterned metal layer and a second patterned metal layer, and decreases the electric field noise coupling by surrounding the left multi-sensor loop and the right multi-sensor loop with a symmetrical shielding metal structure formed by a first patterned shielding metal layer, a second patterned shielding metal layer and a plurality of through vias.

10 Claims, 4 Drawing Sheets

PLANAR MAGNETIC FIELD PROBE

CROSS-REFERENCE TO RELATED APPLICATION

This application claims the priority benefit of Taiwan application serial no. 100102043, filed Jan. 20, 2011. The entirety of the above-mentioned patent application is hereby incorporated by reference herein and made a part of this specification.

BACKGROUND

1. Field of the Invention

The invention relates to a planar magnetic field probe. Particularly, the invention relates to a planar magnetic field probe capable of suppressing electric field coupling and having high sensitivity.

2. Description of Related Art

A near-field magnetic field probe is generally designed as a handheld device, which can be used to measure electromagnetic radiation of an electronic device, or used to position a possible electromagnetic radiation source of the electronic devices.

The magnetic field probe is generally made in the form of a loop. The probe is connected to a measuring instrument (an oscilloscope or a spectrum analyser, etc.) through a transmission line. The measuring instrument obtains a magnetic field strength according to a signal (for example, a voltage signal or a current signal) measured from the transmission line. Taking a digital circuit as an example, the digital circuit generally has a plurality of current loops which generate magnetic fields and the magnetic field probe can be used to measure and analyse the related magnetic fields.

A single loop magnetic field probe is mainly used in the related arts. There are two components of current on the PCB. One is the current on the ground plane and the other is the current on the trace. When the fast transient pulse is injected into the ground plane, the magnetic fields of the trace currents are often much weaker than the magnetic field of the surface current. Therefore it is difficult to measure trace currents by the same magnetic field probe that is used for the ground layer current. However, the field components are different. The trace current has a normal field component. It is possible to separate the trace current by measuring the normal field component over the PCB.

FIG. 1 is a schematic diagram of a conventional method of measuring a magnetic field. A magnetic field Hg generated by the current of a ground layer G1 has two components in X and Y directions, and a magnetic field HS generated by a current I1 of a signal line S1 has three components in X, Y and Z directions. When measuring the magnetic fields, a loop normal of conventional magnetic field probe 102 is perpendicular to the normal of a circuit board 104 and is placed close to the surface of the signal line S1. The magnetic field probe 102 simultaneously measures the magnetic field Hg generated by the current of the ground layer G1 and the magnetic field HS generated by the current I1 of the signal line S1 in the X and the Y directions. Since the current I1 of the signal line S1 is much weaker than the current of the ground layer G1, it is difficult to use the conventional magnetic field probe 102 in measuring the magnetic field Hg generated by the current I1 of the signal line S1.

SUMMARY OF THE INVENTION

The invention is related to a planar magnetic field probe which can accurately measure the magnetic field of a signal line by reducing the magnetic field generated by the current of a ground layer on a circuit board, suppressing electric field coupling, and improving its sensitivity.

The invention provides a planar magnetic field probe for detecting a magnetic field intensity generated by the current of a signal line to be detected. The planar magnetic field probe includes a first substrate, a second substrate, a first through via, a second through via, a first patterned induction metal layer, a first patterned shielding metal layer and a second patterned shielding metal layer. The second substrate is located on the first substrate. The first through via and the second through via penetrate through the first substrate and the second substrate. The first patterned induction metal layer is formed between the first substrate and the second substrate, where the first patterned induction metal layer includes a first induction loop pattern, a second induction loop pattern, and an induction wire. The first induction loop pattern has a first end and a second end, and the first end of the first induction loop pattern is connected to the first through via. The second induction loop pattern has a first end and a second end, and the first end of the second induction loop pattern is connected to the second through via. A first end and a second end of the induction wire are respectively connected to the second end of the first induction loop pattern and the second end of the second induction loop pattern. The induction currents generated by the magnetic field on the first induction loop pattern and the second induction loop pattern have a same current direction on the induction wire. The second and the first patterned shielding metal layers are respectively formed on outer sides of the first substrate and the second substrate, where the first patterned shielding metal layer includes two first symmetric ring-shape patterns and the second patterned shielding metal layer includes two second symmetric ring-shape patterns. Projection areas of the two first symmetric ring-shape patterns and the two second symmetric ring-shape patterns on the second patterned shielding metal layer are overlapped. Projection areas of the first induction loop pattern and the second induction loop pattern on the second patterned shielding metal layer are respectively located within the two second symmetric ring-shape patterns. The first through via and the second through via are respectively located at two sides of the induction wire and between the two second symmetric ring-shape patterns.

In an embodiment of the invention, the two second symmetric ring-shape patterns respectively have the first opening and the second opening at adjacent sides thereof, where the location of the first end and the second end at two sides of the first opening and the location of the first end and the second end at two sides of the second opening are diagonal respectively.

In an embodiment of the invention, the second patterned shielding metal layer further includes a first shielding wire and a second shielding wire. The first shielding wire is connected to the first end of the first opening and the first through via. The second shielding wire is connected to the first through via and the first end of the second opening.

In an embodiment of the invention, when the planar magnetic field probe is placed close to the surface of the signal line to be detected to measure the magnetic field intensity, the geometric centers of the first induction loop pattern and the second induction loop pattern are respectively located close to two edges of the signal line to be detected to achieve a maximum induction current.

In an embodiment of the invention, the planar magnetic field probe further includes a third substrate and a second patterned induction metal layer. The third substrate is located between the first patterned shielding metal layer and the second substrate. The second patterned induction metal layer is formed between the third substrate and the second substrate, and the second patterned induction metal layer includes a third and a fourth induction loop patterns. A first end and a second end of the third induction loop pattern are respectively connected to the second end of the first induction loop pattern and the first end of the induction wire. A first end and a second end of the fourth induction loop pattern are respectively connected to the second through via and the first end of the second induction loop pattern.

In an embodiment of the invention, the first induction loop pattern and the third induction loop pattern form a first multi-induction loop, the second induction loop pattern and the fourth induction loop pattern form a second multi-induction loop, and the winding directions of the first multi-induction loop and the second multi-induction loop are reversed.

In an embodiment of the invention, the material of the first substrate, the second substrate, and the third substrate is fibreglass.

In an embodiment of the invention, the planar magnetic field probe further includes a plurality of third through vias connected to the two first symmetric ring-shape patterns and the two second symmetric ring-shape patterns, where the third through vias are arranged along inner side of the outline of each of the first symmetric ring-shape patterns and each of the second symmetric ring-shape patterns without being connected to the first patterned induction metal layer.

In an embodiment of the invention, the second through via is connected to a measuring module through a signal line of a coaxial cable. One of the third through vias is connected to a shielding layer of the coaxial cable, and the measuring module measures a voltage signal on the signal line of the coaxial cable to obtain the magnetic field intensity.

In an embodiment of the invention, the first induction loop pattern is symmetric to the second induction loop pattern, and the third induction loop pattern is symmetric to the fourth induction loop pattern.

According to the above descriptions, a left multi-induction loop and a right multi-induction loop formed by the first patterned induction metal layer and the second patterned induction metal layer are used to increase sensitivity of detecting the magnetic field intensity, and a symmetrical shielded metal structure formed by the first patterned shielding metal layer and the second patterned shielding metal layer is used to surround the left multi-induction loop and the right multi-induction loop to reduce the electric field noise coupling. In this way, the sensitivity of the magnetic field intensity detection is increased and the electric field coupling is suppressed.

In order to make the aforementioned features and advantages of the invention comprehensible, several exemplary embodiments accompanied with figures are described in detail below.

BRIEF DESCRIPTION OF THE DRAWINGS

The accompanying drawings incorporated in and constitute a part of this specification are included to provide a further understanding of the invention. The drawings illustrate embodiments of the invention and, together with the description, serve to explain the principles of the invention.

DETAILED DESCRIPTION OF DISCLOSED EMBODIMENTS

Figure 1:
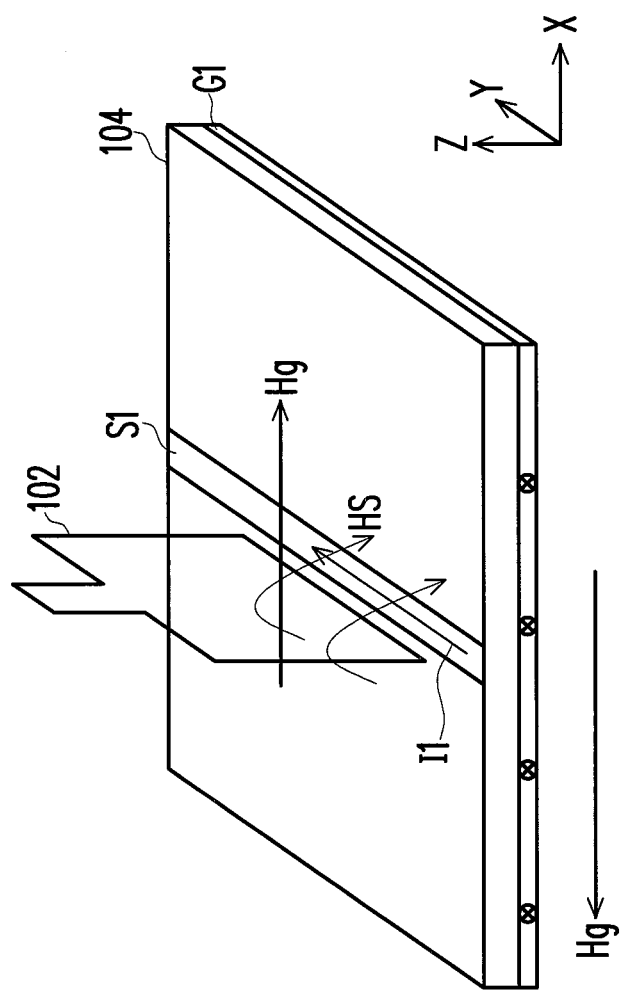
FIG. 1 is a schematic diagram of a conventional method measuring the magnetic field of a signal line.
Figure 2:
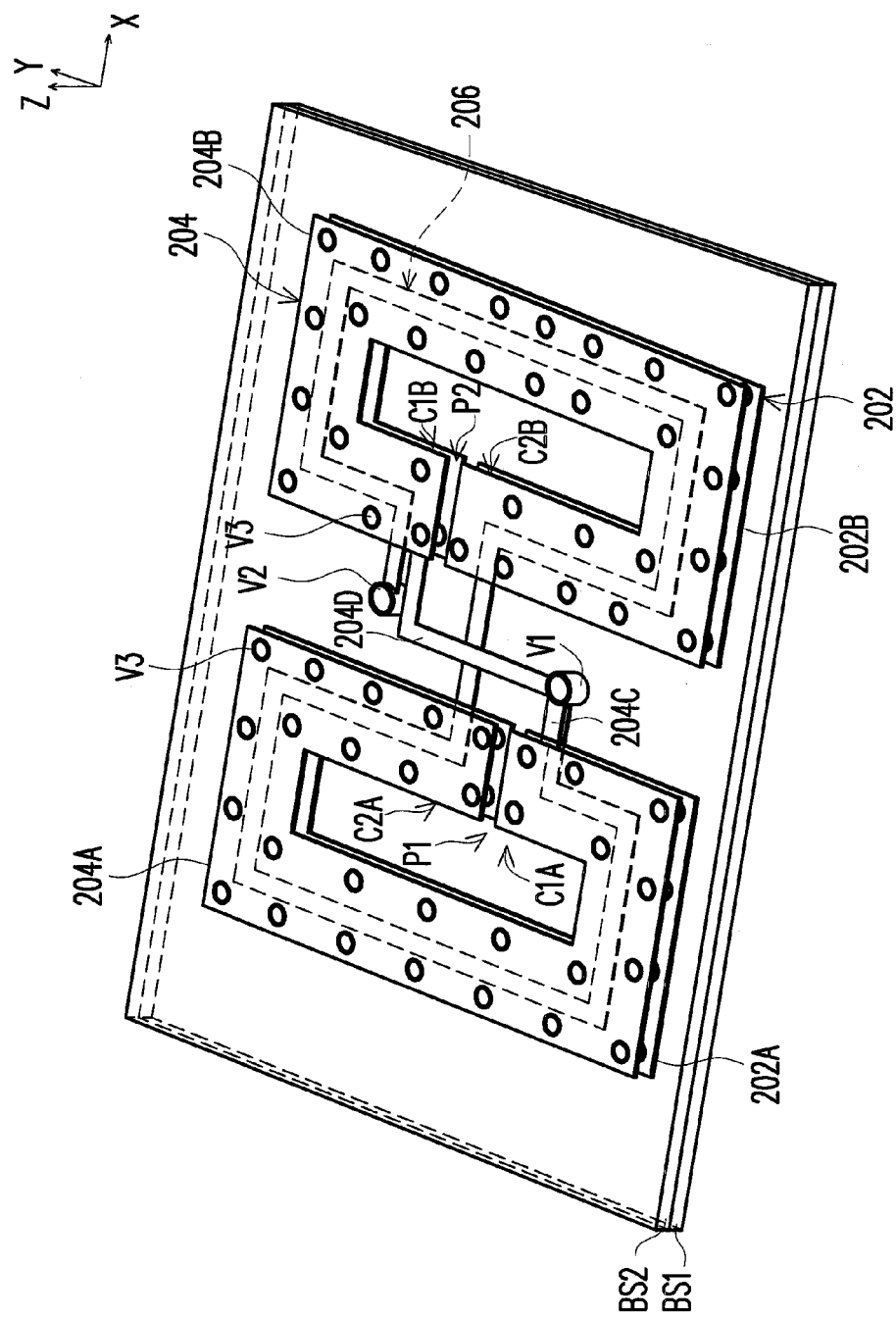
FIG. 2 is a schematic diagram of a planar magnetic field probe according to the embodiment of the invention.

FIG. 2 is a schematic diagram of a planar magnetic field probe according to an embodiment of the invention. Referring to FIG. 2, the planar magnetic field probe 200 is fabricated on a multi-layer printed circuit board. In the present embodiment, the planar magnetic field probe 200 includes a first substrate BS1, a second substrate BS2, a first through via V1, a second through via V2, and a plurality of third through vias V3 penetrating through the first substrate BS1 and the second substrate BS2, where the first substrate BS1 and the second substrate BS2 are, for example, made of fibreglass. A first patterned shielding metal layer 202 and a second patterned shielding metal layer 204 are respectively formed on the outer sides of the first substrate BS1 and the second substrate BS2, and a first patterned induction metal layer 206 is formed between the first substrate BS1 and the second substrate BS2.

Figure 3:
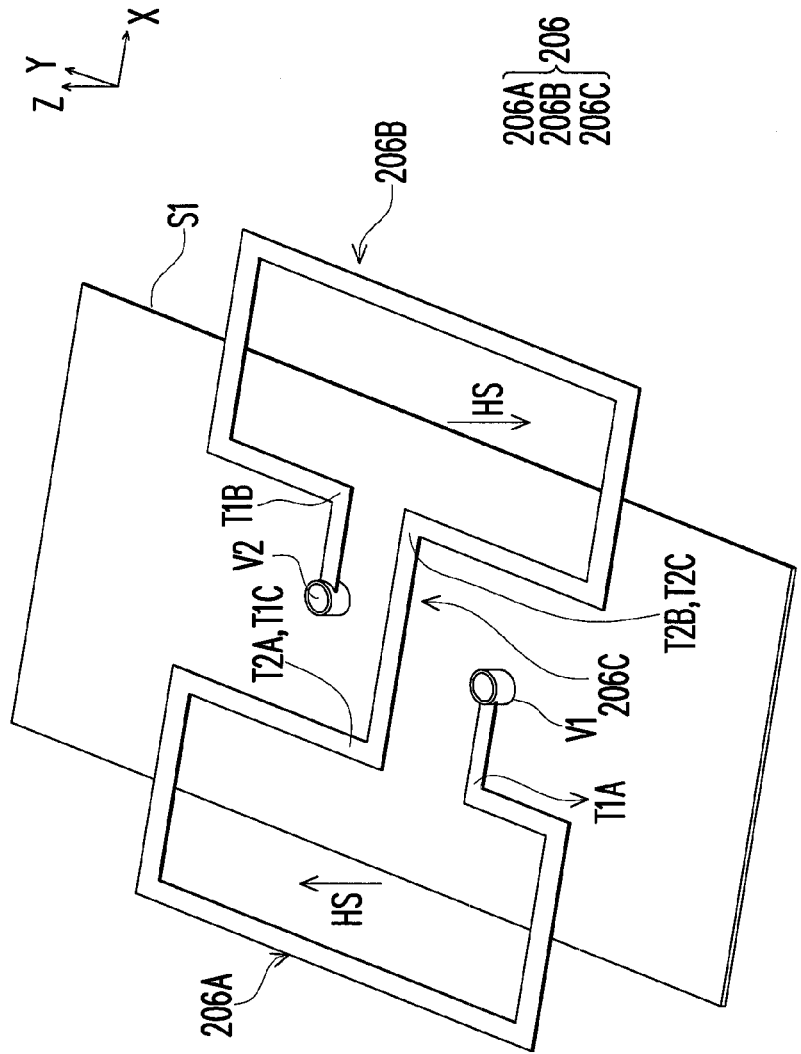
FIG. 3 is a structural schematic diagram of a first patterned induction metal layer according to the embodiment of the invention.

The structure of first patterned induction metal layer 206 is shown in FIG. 3 in detail. The first patterned induction metal layer 206 includes a first induction loop pattern 206A, a second induction loop pattern 206B, and a induction wire 206C, where the first induction loop pattern 206A is symmetric to the second induction loop pattern 206B, and the first through via V1 and the second through via V2 are respectively located at two sides of the induction wire 206C. The first induction loop pattern 206A has a first end T1A and a second end T2A, the second induction loop pattern 206B has a first end T1B and a second end T2B, and the induction wire 206C has a first end T1C and a second end T2C. The first end T1A and the second end T2A of the first induction loop pattern 206A are respectively connected to the first through via V1 and the first end T1C of the induction wire 206C, and the first end T1B and the second end T2B of the second induction loop pattern 206B are respectively connected to the second through via V2 and the second end T2C of the induction wire 206C.

When the planar magnetic field probe 200 is placed closely to the surface of a signal line S1 for measuring the magnetic field intensity, since the Z component of magnetic fields HS near two edges of the signal line S1 are reversed, induction currents generated by the first induction loop pattern 206A and the second induction loop pattern 206B have a same current direction. For example, in the present embodiment, the direction of the magnetic field HS corresponding to the first induction loop pattern 206A is in +Z direction, so the induction current thereof is clockwise, while the direction of the magnetic field HS corresponding to the second induction loop pattern 206B is in −Z direction, so the induction current thereof is anticlockwise. Therefore, the induction currents of the two induction loop patterns 206A and 206B all flow from the first end T1C to the second end T2C on the induction wire 206C.

It should be noted that sizes and positions of the first induction loop pattern 206A and the second induction loop pattern 206B can be designed to satisfy the following condition: when the planar magnetic field probe 200 is placed closely to the surface of the signal line S1 to measure the magnetic field intensity, geometric centers of the first induction loop pattern 206A and the second induction loop pattern 206B are respectively located close to two side edges of the signal line S1 to achieve the maximum induction current. Since the Z component magnetic field intensities are the strongest near the two side edges of the signal line 51, such design have an optimal coupling of magnetic field to be measure. Moreover, the shape of the first induction loop pattern 206A and the second induction loop pattern 206B is not limited to be symmetric rectangle, which can also be symmetric circle, ellipse or other shapes.

Referring to FIG. 2, in the present embodiment, the second pattered shielding metal layer 204 includes two second symmetric ring-shape patterns 204A, 204B, a first shielding wire 204C, and a second shielding wire 204D. The first through via V1 and the second through via V2 are located between the second symmetric ring-shape patterns 204A and 204B. The two second symmetric ring-shape patterns 204A and 204B respectively have a first opening P1 and a second opening P2, where two sides of the first opening P1 are respectively the first end CIA and the second end C2A and two sides of the second opening P2 are respectively the first end C1B and the second end C2B of 204B. The location of first end CIA and the second end C2A and the location of the first end C1B and the second end C2B are respectively diagonal. The first shielding wire 204C connected to the first end CIA of the first opening P1 and the first through via V1, the second shielding wire 204D connected to the first through via V1 and the first end C1B of the second opening P2, and the second patterned shielding metal layer 204 form an S-shape pattern on the second substrate BS2.

On the other hand, the first pattered shielding metal layer 202 also includes two first symmetric ring-shape patterns 202A and 202B, where the first symmetric ring-shape patterns 202A and 202B respectively are of the same shape as that of the second symmetric ring-shape patterns 204A and 204B and are respectively located on the top layer of the first substrate BS1 corresponding to that of the first symmetric ring-shape patterns 204A and 204B. Namely, projection areas of the first symmetric ring-shape patterns 202A and 202B on the second patterned shielding metal layer 204 are overlapped to the second symmetric ring-shape patterns 204A and 204B. Moreover, projection areas of the first induction loop pattern 206A and the second induction loop pattern 206B on the second patterned shielding metal layer 204 are respectively located within the second symmetric ring-shape patterns 204A and 204B. Since shapes, sizes and positions of the first symmetric ring-shape patterns 202A and 202B respectively correspond to that of the second symmetric ring-shape patterns 204A and 204B, projection areas of the first induction loop pattern 206A and the second induction loop pattern 206B on the first patterned shielding metal layer 202 are also located within the first symmetric ring-shape patterns 202A and 202B. In this way, electric field noise interference caused by the signal line S1 can be reduced by shielding the first induction loop pattern 206A and the second induction loop pattern 206B with the first symmetric ring-shape patterns 202A and 202B and the second symmetric ring-shape patterns 204A and 204B.

In order to achieve a better electric field shielding effect of the planar magnetic field probe 200, in the present embodiment, the third through vias V3 are connected the corresponding first symmetric ring-shape pattern 202A, the second symmetric ring-shape pattern 204A, the corresponding first symmetric ring-shape pattern 202B, and the second symmetric ring-shape pattern 204B, where the third through vias V3 are arranged along inner sides of outlines of the first symmetric ring-shape patterns 202A and 202B and the second symmetric ring-shape patterns 204A and 204B without being connected to the first patterned induction metal layer 206.

Based on the connections of the third through vias V3, the first induction loop pattern 206A and the second induction loop pattern 206B can be completely wrapped by patterned shielding metal layers 202 and 204, so as to improve a metal shielding effect.

When the planar magnetic field probe 200 is used to measure the magnetic field, the second through via V2 of the planar magnetic field probe 200 is connected to a measuring module (not shown) through a signal line of a coaxial cable, and one of the third through vias V3 is connected to a shielding layer of the coaxial cable. The measuring module can detect an electric signal (for example, a voltage signal or a current signal) which is generated from the magnetic field coupling to the planar magnetic field probe through the signal line of the coaxial cable and accordingly obtain a magnitude of the magnetic field HS generated by the signal line S1.

Since when the planar magnetic field probe 200 is used to measure the magnetic field, the planar magnetic field probe 200 is placed closely to the surface of the signal line S1 flatwise and the main coupling direction of the magnetic field is in the Z direction, the influence of the magnetic field (in X and Y directions) generated by the ground layer of the circuit board is thus suppressed.

Moreover, the electric field noise interference generated by the wires of the circuit board can be reduced through the first patterned shielding metal layer 202 and the second patterned shielding metal layer 204 with the symmetric ring-shape patterns. Since when the planar magnetic field probe 200 is used to measure the magnetic field, the planar magnetic field probe 200 is placed symmetrically above the signal line S1, the symmetric metal shielding structure (i.e. the first patterned shielding metal layer 202, the second patterned shielding metal layer 204 and the third through vias V3) can effectively suppress the electric field noise coupling from the signal line S1.

After reducing the coupling from the magnetic field generated by the ground layer of the circuit board and the electric field noise generated by the signal line S1, the magnetic field generated by the signal line S1 can be accurately measured.

Figure 4:
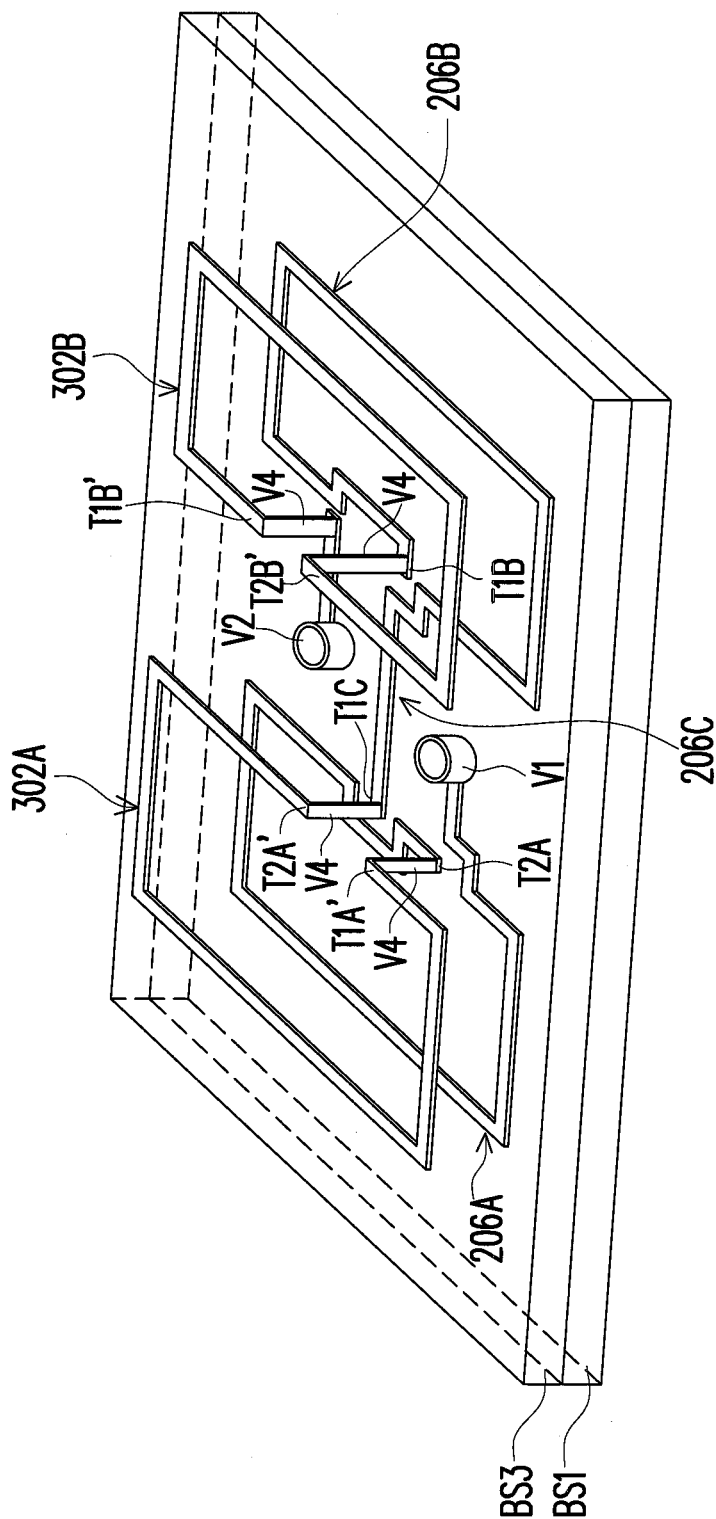
FIG. 4 is a schematic diagram of a multi-induction loop structure according to the embodiment of the invention.

It should be noted that in the embodiments, a multiple induction loop structure can be implemented by using multiple layers of the printed circuit board. For example, FIG. 4 is a schematic diagram of a multi-induction loop structure according to an embodiment of the invention. Referring to FIG. 4, the difference between the multi-induction loop structure of the present embodiment and the first patterned induction metal layer 206 of FIG. 3 is that besides the first induction loop pattern 206A, the second induction loop pattern 206B, and the induction wire 206C, the multi-induction loop structure of the present embodiment further includes a second patterned induction metal layer 302, which is formed on a third substrate BS3.

The third substrate BS3 is located between the first patterned induction metal layer 206 and the second substrate BS2 (which is not illustrated in FIG. 4 for simplicity), and the second patterned induction metal layer 302 is formed between the third substrate BS3 and the second substrate BS2. The second patterned induction metal layer 302 includes a third induction loop pattern 302A and a fourth induction loop pattern 302B, where the third induction loop pattern 302A is symmetric to the fourth induction loop pattern 302B.

The third induction loop pattern 302A, the fourth induction loop pattern 302B, and the first patterned induction metal layer 206 can be connected through a plurality of the fourth through vias V4. The first end T1A' and the second end T2A' of the third induction loop pattern 302A are respectively connected to the second end T2A of the first induction loop pattern 206A and the first end T1C of the induction wire 206C through the fourth through vias V4, and a first end T1B' and a second end T2B' of the fourth induction loop pattern 302B are respectively connected to the second through via V2 and the first end T1B of the second induction loop pattern 206B through the fourth through vias V4.

As shown in FIG. 4, the first induction loop pattern 206A and third induction loop pattern 302A form a first multi-induction loop, and the second induction loop pattern 206B and fourth induction loop pattern 302B form a second multi-induction loop. Winding directions of the first multi-induction loop and the second multi-induction loop are inversed, so that when the magnetic field of a signal line is measured, directions of induction currents on the first multi-induction loop and the second multi-induction loop are the same. By designing the first induction loop pattern 206A and the second induction loop pattern 206B into multi-induction loop structures, the magnitude of the induction current can be effectively increased, so as to increase the sensitivity of the magnetic field probe without increasing a circuit area of the magnetic field probe.

It should be noted that the first multi-induction loop and the second multi-induction loop are also surrounded by the symmetric metal shielding structure (i.e. the first patterned shielding metal layer 202, the second patterned shielding metal layer 204 and the third through vias V3). Moreover, the first multi-induction loop and the second multi-induction loop are not limited to the double layer structures, which can be triple layer structures or multiple layer structures in an actual application, and those skilled in the art can deduce implementations thereof according to the above disclosure, and detailed descriptions thereof are not repeated.

In summary, a left multi-induction loop and a right multi-induction loop formed by the first patterned induction metal layer and the second patterned induction metal layer are used to increase sensitivity of the magnetic field intensity detection without increasing a circuit area of the magnetic field probe. Moreover, a symmetrical shielded metal structure formed by the first patterned shielding metal layer, the second patterned shielding metal layer and the third through vias is used to surround the induction loop patterns of the first patterned induction metal layer and the second patterned induction metal layer to effectively suppress the electric field noise coupling effect generated by the signal line.

It is apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A planar magnetic field probe, for detecting a magnetic field intensity generated by a current of a signal line to be detected, the planar magnetic field probe comprising:
    a first substrate;
    a second substrate, located on the first substrate;
    a first through via, penetrating through the first substrate and the second substrate;
    a second through via, penetrating through the first substrate and the second substrate;
    a first patterned induction metal layer, formed between the first substrate and the second substrate, and the first patterned induction metal layer comprising:
        a first induction loop pattern, having a first end and a second end, and the first end of the first induction loop pattern being connected to the first through via;
        a second induction loop pattern, having a first end and a second end, and the first end of the second induction loop pattern being connected to the second through via; and
        a induction wire, having a first end and a second end respectively connected to the second end of the first induction loop pattern and the second end of the second induction loop pattern, wherein induction currents generated by induction the magnetic field intensity by the first induction loop pattern and the second induction loop pattern have a same current direction on the induction wire;
    a first patterned shielding metal layer; and
    a second patterned shielding metal layer, wherein the second patterned shielding metal layer and the first patterned shielding metal layer are respectively formed on outer sides of the first substrate and the second substrate,
    wherein the first patterned shielding metal layer comprises two first symmetric ring-shape patterns,
    the second patterned shielding metal layer comprises two second symmetric ring-shape patterns, projection areas of the two first symmetric ring-shape patterns on the second patterned shielding metal layer are overlapped to the two second symmetric ring-shape patterns, projection areas of the first induction loop pattern and the second induction loop pattern on the second patterned shielding metal layer are respectively located within the two second symmetric ring-shape patterns, and the first through via and the second through via are located between the two second symmetric ring-shape patterns and are respectively located at two sides of the induction wire.

2. The planar magnetic field probe as claimed in claim 1, wherein the two second symmetric ring-shape patterns respectively have a first opening and a second opening at adjacent sides thereof, wherein a first end and a second end located at two sides of the first opening are respectively diagonal ends relative to a first end and a second end located at two sides of the second opening.

3. The planar magnetic field probe as claimed in claim 2, wherein the second patterned shielding metal layer further comprises:
    a first shielding wire, connected to the first end of the first opening and the first through via; and
    a second shielding wire, connected to the first through via and the first end of the second opening.

4. The planar magnetic field probe as claimed in claim 1, wherein when the planar magnetic field probe is disposed above the signal line to be detected to measure the magnetic field intensity, geometric centers of the first induction loop pattern and the second induction loop pattern are respectively located above two side edges of the signal line to be detected.

5. The planar magnetic field probe as claimed in claim 1 further comprises:
    a third substrate, located between the first patterned shielding metal layer and the second substrate; and
    a second patterned induction metal layer, formed between the third substrate and the second substrate, and the second patterned induction metal layer comprising:
        a third induction loop pattern, having a first end and a second end respectively connected to the second end of the first induction loop pattern and the first end of the induction wire; and a fourth induction loop pattern, having a first end and a second end respectively connected to the second through via and the first end of the second induction loop pattern.

6. The planar magnetic field probe as claimed in claim 5, wherein the first induction loop pattern and the third induction loop pattern form a first multi-induction loop, the second induction loop pattern and the fourth induction loop pattern form a second multi-induction loop, and winding directions of the first multi-induction loop and the second multi-induction loop are inversed.

7. The planar magnetic field probe as claimed in claim 5, wherein a material of the first substrate, the second substrate and the third substrate comprises fibreglass.

8. The planar magnetic field probe as claimed in claim 1, further comprising:
a plurality of third through vias, connected to the two first symmetric ring-shape patterns and the two second symmetric ring-shape patterns, wherein the third through vias are arranged along inner side of an outline of each of the first symmetric ring-shape patterns and each of the second symmetric ring-shape patterns without being connected to the first patterned induction metal layer.

9. The planar magnetic field probe as claimed in claim 1, wherein the second through via is connected to a measuring module through a signal line of a coaxial cable, one of the third through vias is connected to a shielding layer of the coaxial cable, and the measuring module measures an electric signal on the signal line of the coaxial cable to obtain the magnetic field intensity.

10. The planar magnetic field probe as claimed in claim 1, wherein the first induction loop pattern is symmetric to the second induction loop pattern, and the third induction loop pattern is symmetric to the fourth induction loop pattern.

* * * * *